United States Patent
Li et al.

(10) Patent No.: US 7,473,608 B2
(45) Date of Patent: Jan. 6, 2009

(54) N-CHANNEL MOSFETS COMPRISING DUAL STRESSORS, AND METHODS FOR FORMING THE SAME

(75) Inventors: Jinghong H. Li, Poughquag, NY (US); Yaocheng Liu, Elmsford, NY (US); Zhijiong Luo, Carmel, NY (US); Anita Madan, Danbury, CT (US); Nivo Rovedo, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/840,795

(22) Filed: Aug. 17, 2007

(65) Prior Publication Data

US 2007/0281413 A1 Dec. 6, 2007

Related U.S. Application Data

(62) Division of application No. 11/420,047, filed on May 24, 2006, now Pat. No. 7,279,758.

(51) Int. Cl.
*H01L 21/22* (2006.01)

(52) U.S. Cl. .................. 438/303; 438/305; 438/549

(58) Field of Classification Search ............ 438/303, 438/305, 549; 257/408, 344
See application file for complete search history.

(56) References Cited

U.S. PATENT DOCUMENTS

| | | | |
|---|---|---|---|
| 6,861,318 B2 | 3/2005 | Murthy et al. | |
| 6,906,360 B2 | 6/2005 | Chen et al. | |
| 7,002,209 B2 | 2/2006 | Chen et al. | |
| 7,067,868 B2 | 6/2006 | Thean et al. | |
| 7,279,758 B1 * | 10/2007 | Li et al. ............ | 257/408 |
| 2002/0016049 A1 | 2/2002 | Curello et al. | |
| 2002/0027254 A1 | 3/2002 | Kwean | |
| 2004/0009626 A1 | 1/2004 | Tweet et al. | |
| 2005/0082616 A1 | 4/2005 | Chen et al. | |
| 2005/0127436 A1 | 6/2005 | Henson et al. | |
| 2005/0191816 A1 | 9/2005 | Vanderpool et al. | |
| 2006/0022282 A1 | 2/2006 | Wirbeleit et al. | |

(Continued)

OTHER PUBLICATIONS

Ohta, H. et al., "High Performance 30 nm Gate Bulk CMOS for 45 nm Node with Σ-shaped SiGe-SD", IEEE, 2005.

(Continued)

*Primary Examiner*—Mark Prenty
(74) *Attorney, Agent, or Firm*—Scully, Scott, Murphy & Presser, P.C.; Joseph P. Abate, Esq.

(57) ABSTRACT

The present invention relates to a semiconductor device comprising at least one n-channel field effect transistor (n-FET). Specifically, the n-FET comprises first and second patterned stressor layers that both contain a carbon-substituted and tensilely stressed single crystal semiconductor. The first patterned stressor layer has a first carbon concentration and is located in source and drain (S/D) extension regions of the n-FET at a first depth. The second patterned stressor layer has a second, higher carbon concentration and is located in S/D regions of the n-FET at a second, deeper depth. Such an n-FET with the first and second patterned stressor layers of different carbon concentration and different depths provide improved stress profile for enhancing electron mobility in the channel region of the n-FET.

18 Claims, 3 Drawing Sheets

U.S. PATENT DOCUMENTS

2006/0097318 A1 5/2006 Li
2006/0186470 A1 8/2006 Chen et al.
2006/0186557 A1 8/2006 Shima et al.
2006/0220119 A1 10/2006 Lin et al.
2006/0255415 A1 11/2006 Freeman et al.

OTHER PUBLICATIONS

Chidambaram, P. R. et al. "35% Drive Current Improvement from Recessed-SiGe Drain Extensions on 37 nm Gate Length PMOS", Symp. VLSI Tech. Dig. Tech. Pap., IEEE, 2004, p. 48-49.

* cited by examiner

N-CHANNEL MOSFETS COMPRISING DUAL STRESSORS, AND METHODS FOR FORMING THE SAME

RELATED APPLICATIONS

This application is a divisional application of U.S. Ser. No. 11/420,047 filed May 24, 2006.

FIELD OF THE INVENTION

The present invention relates to complementary metal-oxide-semiconductor (CMOS) devices with enhanced carrier mobility. More specifically, the present invention relates to n-channel metal-oxide-semiconductor field effect transistors (n-MOSFETs) having dual stressors for enhancing electronic mobility in channel regions of such n-MOSFETs.

BACKGROUND OF THE INVENTION

Mechanical stresses within a semiconductor device substrate can be used to modulate device performance. For example, in silicon, hole mobility is enhanced when the silicon film is under compressive stress, while the electron mobility is enhanced when the silicon film is under appropriate tensile stress. Therefore, compressive or tensile stress can be advantageously created in the channel region of a p-MOSFET or an n-MOSFET in order to enhance the performance of such a device.

One conventional approach for creating a desirable stressed silicon channel region is to form such a channel region directly on top of a stress-inducing buffer layer. For example, a tensilely stressed silicon channel layer can be formed by epitaxially growing silicon directly over a thick, relaxed SiGe buffer layer. The lattice constant of germanium is about 4.2% greater than that of silicon, and the lattice constant of a silicon-germanium alloy is linear with respect to its germanium concentration. As a result, the lattice constant of a SiGe alloy with twenty atomic percent of germanium is about 0.8% greater than the lattice constant of silicon. Epitaxial growth of silicon directly on top of such a SiGe buffer layer will yield a silicon channel layer under tensile stress, with the underlying SiGe buffer layer being essentially unstrained, or "relaxed".

The use of such a strain-inducing SiGe layer has several inherent disadvantages: (1) formation of relaxed SiGe buffer layer relies on defect formation, and consequentially, the SiGe material has a high defect density, which propagates into the silicon channel layer thereabove and poses significant challenges for device applications, such as control of leakage current and device yield, and (2) the presence of the SiGe layer directly underneath the channel region creates processing issues, such as deleterious diffusion of germanium into the strained silicon channel, high resistance silicide formation and altered dopant diffusion.

There is a continuing need for improved semiconductor devices containing high performance MOSFET components.

SUMMARY OF THE INVENTION

The present invention provides an n-channel field effect transistor (n-FET) comprising dual stressors for applying desired tensile stress to the channel region of the n-FET. The dual stressors in the n-FET of the present invention provide an improved stress profile in the channel region of the n-FET, without otherwise compromising the device performance of the n-FET.

In one aspect, the present invention relates to a semiconductor device comprising at least one n-channel field effect transistor (n-FET). The at least one n-FET specifically comprises first and second patterned stressor layers, both of which comprise a carbon-substituted and tensilely stressed single crystal semiconductor. The first patterned stressor layer has a first substitutional carbon concentration and is located in source and drain (S/D) extension regions of the n-FET. The second patterned stressor layer has a second, higher substitutional carbon concentration and is located in S/D regions of the n-FET.

Preferably, but not necessarily, the first substitutional carbon concentration ranges from about 0.2 atomic % to about 2.5 atomic %, and the second, higher substitutional carbon concentration ranges from about 0.5 atomic % to about 4 atomic %. More preferably, the first substitutional carbon concentration ranges from about 0.5 atomic % to about 2 atomic %, and the second, higher substitutional carbon concentration ranges from about 0.8 atomic % to about 3 atomic %.

The first and second patterned stressor layers may be respectively located in the S/D extension regions and the S/D regions at substantially the same depth or at significantly different depths. In one specific embodiment of the present invention, the first patterned stressor layer is located in the S/D extension regions at a first, relatively shallow depth, and the second patterned stressor layer is located in the S/D regions at a second, relatively deep depth. In an alternative embodiment of the present invention, the first patterned stressor layer is located in the S/D extension regions at a first, relatively deep depth, and the second patterned stressor layer is located in the S/D regions at a second, relatively shallow depth. In a further alternative embodiment of the present invention, the first and second patterned stressor layers are respectively located in the S/D extension regions and the S/D regions at substantially the same depths.

The first patterned stressor layer is preferably located in the S/D extension regions of the n-FET at a first depth ranging from about 5 nm to about 80 nm, and more preferably from about 10 nm to about 50 nm. The second patterned stressor layer is preferably located in the S/D regions of the n-FET at a second depth ranging from about 10 nm to about 150 nm, and more preferably from about 20 nm to about 80 nm.

The first and second patterned stressor layers may comprise any suitable carbon-substituted and tensilely stressed single crystal semiconductor. Preferably, the first and second patterned stressor layers both comprise tensilely stressed single crystal silicon with substitutional carbon atoms located therein.

In another aspect, the present invention relates to a method for forming a semiconductor device comprising:

forming a patterned gate stack over a substrate that comprises a single crystal semiconductor;

forming a first set of amorphous regions in the substrate using the patterned gate stack as a mask, wherein the first set of amorphous regions comprise n-type source and drain (S/D) extension implants, and wherein the first set of amorphous regions further comprise implanted carbon ions at a first carbon concentration;

forming one or more masking structures along sidewalls of the patterned gate stack; forming a second set of amorphous regions in the substrate using the patterned gate stack and the one or more masking structures as masks, wherein the second set of amorphous regions comprise n-type S/D implants, and wherein the second set of amorphous regions further comprise implanted carbon ions at a second, higher carbon concentration; and annealing the substrate to recrystallize the first and second sets of amorphous regions, thereby forming an n-channel field effect transistor (n-FET) comprising S/D extension regions and S/D regions, wherein the S/D extension regions comprise a first patterned stressor layer that comprises a carbon-substituted and tensilely stressed single crystal semiconductor material and has a first substitutional carbon concentration, and wherein the S/D regions comprise a second patterned stressor layer that also comprises the carbon-substituted and tensilely stressed single crystal semiconductor material but has a second, higher substitutional carbon concentration.

In a further aspect, the present invention relates to a method for forming a semiconductor device comprising:

forming a patterned gate stack over a substrate that comprises a single crystal semiconductor; conducting a first masked pre-amorphization implantation to form a first set of amorphous regions in the substrate;

conducting n-type source and drain (S/D) extension implantation at the first set of amorphous regions;

conducting a first carbon implantation to implant a first dosage of carbon ions into the first set of amorphous regions;

forming one or more spacers along sidewalls of the patterned gate stack;

conducting a second masked pre-amorphization implantation to form a second set of amorphous regions in the substrate;

conducting n-type S/D implantation at the second set of amorphous regions;

conducting a second carbon implantation to implant a second, larger dosage of carbon ions into the second set of amorphous regions; and annealing the substrate to recrystallize the first and second sets of amorphous regions, thereby forming an n-channel field effect transistor (n-FET) comprising source/drain (S/D) extension regions and S/D regions, wherein the S/D extension regions comprises a first patterned stressor layer that comprises a carbon-substituted and tensilely stressed single crystal semiconductor material and has a first substitutional carbon concentration, and wherein the S/D regions comprises a second patterned stressor layer that also comprises the carbon-substituted and tensilely stressed single crystal semiconductor material but has a second, higher substitutional carbon concentration.

The first and second carbon implantation steps may be carried out at approximately the same energy level or at significantly different energy levels. In one specific embodiment of the present invention, the first carbon implantation step is carried out at a first, relatively low energy level, and the second carbon implantation step is carried out at a second, relatively high energy level. In an alternative embodiment of the present invention, the first carbon implantation step is carried out at a first, relatively high energy level, and the second carbon implantation step is carried out at a second, relatively low energy level. In a further alternative embodiment of the present invention, the first and second carbon implantation steps are carried out at approximately the same energy level.

Preferably, but not necessarily, the first carbon implantation step is conducted at a first energy level ranging from about 0.5 KeV to about 15 KeV, and the second carbon implantation step is conducted at a second energy level ranging from about 1 KeV to about 25 KeV. More preferably, the first energy level ranges from about 1 KeV to about 10 KeV, and the second energy level ranges from about 1 KeV to about 15 KeV.

The first dosage of carbon ions may range from about $1 \times 10^{14}/cm^2$ to about $1 \times 10^{16}/cm^2$, and the second, higher dosage of carbon ions may range from about $5 \times 10^{14}/cm^2$ to about $2 \times 10^{16}/cm^2$. More preferably, the first dosage may range from about $5 \times 10^{14}/cm^2$ to about $5 \times 10^{15}/cm^2$, and the second, higher dosage may range from about $1 \times 10^{15}/cm^2$ to about $1 \times 10^{16}/cm^2$.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The term "Si:C" or "carbon-substituted single crystal silicon" as used herein refers to single crystal silicon having substitutional carbon atoms located therein. The carbon-substituted single crystal silicon may or may not contain interstitial carbon atoms (the difference between substitutional carbon atoms and interstitial carbon atoms will be explained in greater detail hereinafter). The substitutional carbon atoms and the silicon atoms in Si:C form a silicon-carbon alloy, which is still a semiconductor material. The Si:C as used in the present invention is therefore distinguished from silicon carbide, which is a dielectric material that contains a carbon-silicon compound. Similarly, the term "Ge:C" or "carbon-substituted single crystal germanium" as used herein refers to a germanium-carbon alloy that contains single crystal germanium having substitutional carbon atoms therein, instead of the compound form of germanium carbide.

The improved FET device of the present invention as well as the exemplary processing steps for fabricating the same will now be described in greater detail by referring to the accompanying FIGS. 1-4.

Figure 1:
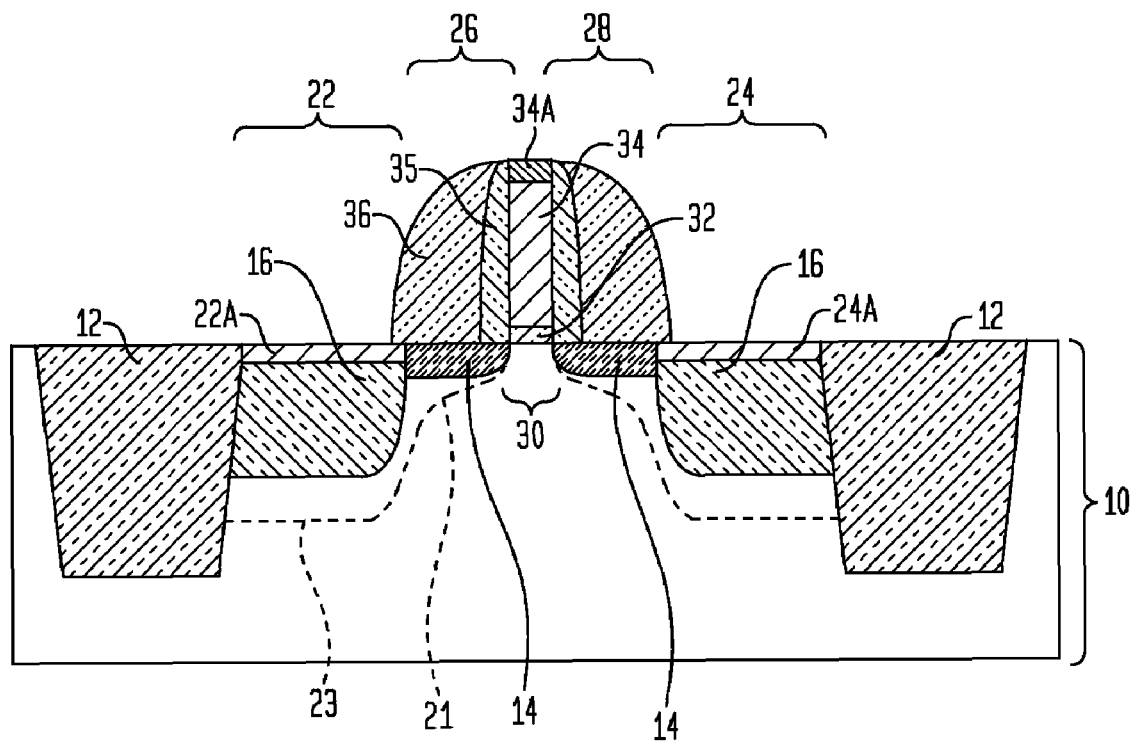
FIG. 1 shows a cross-sectional view of an exemplary n-FET that comprises dual Si:C stressors, according to one embodiment of the present invention.

Reference is first made to FIG. 1, which shows an n-FET device having a source region 22, a drain region 24, a source extension region 26, a drain extension region 28 and a channel region 30 located in a semiconductor substrate 10. Dotted line 21 indicates the doping level in the source and drain (S/D) extension regions 26 and 28, and line 23 indicates the doping level in the S/D regions 22 and 24. A gate dielectric layer 32 is located directly over the channel region 30 of the n-FET, and a gate conductor 34 is located directly over the gate dielectric layer 32. The n-FET may further comprise silicide contact layers 22A and 24A over the S/D regions 22 and 24 and a gate silicide contact layer 34A over the gate conductor 34. Optional spacers 35 and 36 can be, but are not necessarily, provided along sidewalls of the gate conductor 34 and above the S/D extension regions 26 and 28 of the n-FET.

The semiconductor substrate 10 may comprise any semiconductor material including, but not limited to: Si, SiC, SiGe, SiGeC, Ge, GaAs, InAs, InP, as well as other III-V or II-VI compound semiconductors. Semiconductor substrate 10 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein. The semiconductor substrate 10 may include one or more doped device regions (not shown), which may have either the same or different conductivities and/or doping concentrations. The doped device regions are typically known as "wells".

The semiconductor substrate 10 may be strained, unstrained, or contain regions of strained and unstrained semiconductor materials therein. Moreover, the semiconductor substrate 10 may have a single crystallographic surface orientation or multiple crystallographic surface orientations.

One or more isolation regions 12 are typically formed into the semiconductor substrate 10 to provide isolation between adjacent devices. The isolation regions 12 may be trench isolation regions or field oxide isolation regions. The trench isolation regions can be formed utilizing a conventional trench isolation process well known to those skilled in the art. For example, lithography, etching and filling of the trenches with a trench dielectric may be used in forming the trench isolation regions. Optionally, a liner may be formed in the trenches prior to trench fill, a densification step may be performed after the trench fill and a planarization process may follow the trench fill as well. The field oxide isolation regions may be formed utilizing a so-called local oxidation of silicon process.

A first patterned stressor layer 14 comprising at least two isolated portions (as shown in FIG. 1) is located in the S/D extension regions 26 and 28 of the n-FET, and a second patterned stressor layer 16 also comprising at least two isolated portions (as shown in FIG. 1) is located in the S/D regions 22 and 24 of the n-FET. Both the first and second patterned stressor layers 14 and 16 contain intrinsic tensile stress, so that the channel region 30 of the n-FET are "pulled" by these two stressor layers 14 and 16 at both ends. Desired tensile stress is therefore generated in the channel region 30 of the n-FET for enhancing electron mobility therein.

Both the first and second patterned stressor layers 14 and 16 comprise a carbon-substituted single crystal semiconductor material. The carbon-substituted single crystal semiconductor material has a lattice constant smaller than that of the surrounding substrate material 10, thereby generating tensile stress therein due to the lattice mismatch between such a carbon-substituted single crystal semiconductor material and the surrounding substrate material 10.

Suitable single crystal materials that can be carbon doped to form the carbon-substituted and tensilely stressed single crystal materials of the present invention include, but are not limited to: silicon, germanium, GaAs, InP, and etc. Therefore, the first and second patterned stressor layers 14 and 16 may comprise any suitable material selected from the group consisting of: Si:C, Ge:C, GaAs:C, InP:C, etc. In a particularly preferred embodiment of the present invention, the substrate material 10 comprises Si, and both the first and second patterned stressor layers 14 and 16 comprise Si:C, which has a lattice constant smaller than Si and is therefore tensilely stressed due to the lattice mismatch between Si:C and Si.

Because the first patterned stressor layer 14 is located in the S/D extension regions 26 and 28 in close proximity to the channel region 30 of the n-FET, significantly more electron mobility enhancement can be achieved in the channel region 30 of the n-FET of the present invention, in comparison with conventional n-FETs that only contain stressor structures in their S/D regions.

The first and second patterned stressor layers 14 and 16 can be readily formed by a solid phase epitaxy (SPE) process, which is effectuated by amorphization implantation, carbon implantation, and annealing. However, stacking faults (i.e., crystal defects) may be generated in the first and second patterned stressor layers 14 and 16 during the SPE process, which can adversely affect the device performance of the n-FET.

The inventors of the present invention have discovered that the density of the stacking faults generated during the SPE process correlates with the substitutional carbon concentrations in the stressor layers 14 and 16, i.e., the higher the substitutional carbon concentration, the higher the density of stacking faults. Further, the inventors of the present invention have discovered that a large portion of the stacking faults is within the silicidation range, i.e., a large portion of the stacking faults can be consumed by formation of surface silicide contact layers.

Therefore, the present invention solves the stacking defect problem by providing a dual stressor configuration, in which the first patterned stressor layer 14 having a relatively low substitutional carbon concentration is located in the un-silicidated S/D extension regions 26 and 28, and the second patterned stressor layer 16 having a relatively high substitutional carbon concentration is located in the silicided S/D regions 22 and 24. Consequently, fewer or no stacking faults are generated in the first patterned stressor layer 14, due to the relatively low substitutional carbon concentration in layer 14. Although more stacking faults are generated in the second patterned stressor layer 16 due to the relatively high substitutional carbon concentration in layer 16, most of the stacking faults so generated are subsequently consumed by S/D silicidation when the S/D silicide contact layers 22A and 24A are formed. Therefore, an enhanced stress profile can be achieved in the n-FET by using such a dual stressor configuration, while little or no overall stacking faults are generated therein.

The relatively low substitutional carbon concentration in the first patterned stressor layer 14 preferably ranges from about 0.2 atomic % to about 2.5 atomic %, and more preferably from about 0.5 atomic % to about 2 atomic %. The relatively high substitutional carbon concentration in the second patterned stressor layer 16 preferably ranges from about 0.5 atomic % to about 4 atomic %, and more preferably from about 0.8 atomic % to about 3 atomic %.

Further, the inventors of the present invention have discovered that in carbon-substituted single crystal semiconductor materials, the amount of substitutional carbon atoms (e.g., the carbon atoms that substitute the silicon or germanium atoms and form a part of the crystal lattice in single crystal silicon or germanium, in distinction with interstitial carbon atoms that are present interstitially between crystal lattices but do not constitute a part of the crystal lattice) increases with the total carbon concentration, but not linearly. In other words, more carbon atoms are present in the interstitial sites between crystal unit cells when the total carbon concentration increases. The presence of interstitial carbon atoms in the S/D junctions, which are spaced apart from the channel region of the n-FET, has little or no adverse impact on the n-FET device performance. However, the presence of interstitial carbon atoms in the S/D extension junctions, which are located immediately adjacent to the channel region of the n-FET, would cause junction leakage and carrier mobility degradation.

Such a problem associated with interstitial carbon can also be solved by incorporation of the dual stressor structure, as described hereinabove. Specifically, the first patterned stressor layer 14 having a relatively low total carbon concentration is provided in the S/D extension regions 26 and 28, and the second patterned stressor layer 16 having a relatively high total carbon concentration is provided in the S/D regions 22 and 24. Consequently, the carbon atoms in the S/D extension regions 26 and 28 are primarily substitutional carbon atoms, due to the relatively low total carbon concentration in the first patterned stressor layer 14. Since the first patterned stressor layer 14 is located in proximity to the channel 30, it can effectively stress the channel even with a relatively low carbon concentration. In contrast, the carbon atoms in the S/D regions 22 and 24 may include a certain amount of interstitial carbon atoms, due to the relatively high total carbon concentration in the second patterned stressor layer 16, but such interstitial carbon atoms are located in the S/D regions 22 and 24, which are far away from the channel region 30, and therefore have little or no adverse impact on the n-FET device performance.

The first and second patterned stressor layer 14 may be located in any suitable depth in the S/D extension and S/D regions. In one specific embodiment of the present invention, the first stressor layer 14 is located in the S/D extension regions at a relatively shallow depth, and the second stressor layer 16 is located in the S/D regions at a relatively deep depth, as shown in FIG. 1. Alternatively, the first stressor layer 14 is located in the S/D extension regions at a relatively deep depth, and the second stressor layer 16 is located in the S/D regions at a relatively shallow depth. Further, the first and second stressor layers 14 and 16 may be located in the S/D extension and S/D regions at approximately the same depth. Preferably, the first patterned stressor layer 14 is located in the S/D extension regions 26 and 28 at a depth ranging from about 5 nm to about 80 nm, and more preferably from about 10 nm to about 50 nm, while the second patterned stressor layer 16 is located in the S/D regions 22 and 24 at a depth ranging from about 10 nm to about 150 nm, and more preferably from about 20 nm to about 80 nm.

The dual stressor configuration provided by the present invention therefore establishes an improved stress profile in the n-FET device, without otherwise compromising the device performance of the n-FET.

Figure 3:
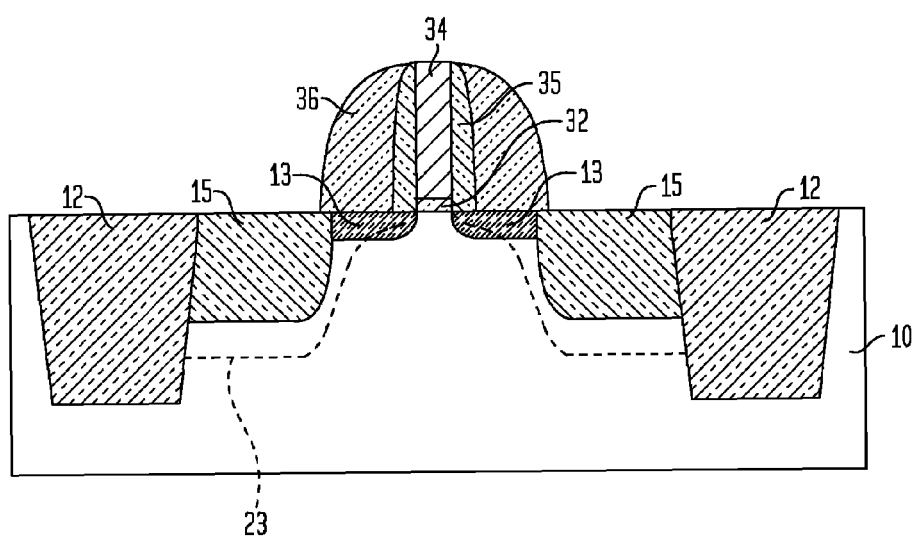
Figure 4:
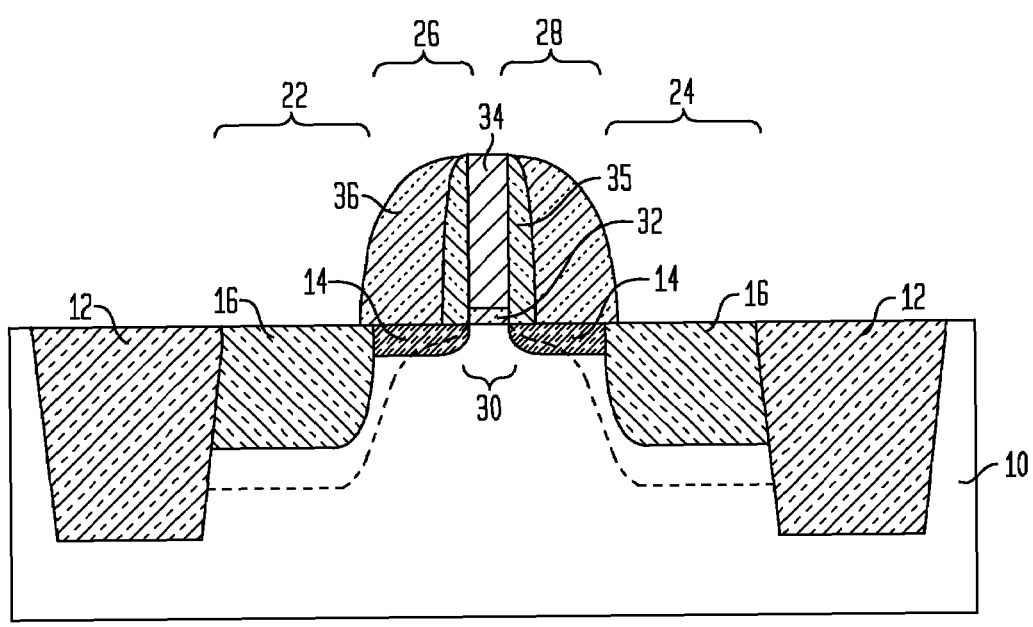

The n-FET device structures of the present invention can be readily fabricated by any suitable method. Specifically, FIGS. 2-4 illustrate a sequence of exemplary processing steps that can be used for fabricating such an n-FET device structure, according to a specific embodiment of the present invention.

First, a semiconductor substrate 10, which may comprise any suitable semiconductor material such as Si, SiC, SiGe, SiGeC, Ge, GaAs, InAs, InP, as well as other III-V or II-VI compound semiconductors, is provided. Preferably, the semiconductor substrate 10 comprises a semiconductor material in its single crystal form.

Trench isolation regions 12 are then formed in the semiconductor substrate 10 to define a device region for an n-FET to be formed. Next, a patterned gate stack comprising a gate dielectric layer 32, a gate conductor 34 and an optional spacer 35 is formed over the semiconductor substrate 10. Formation of the trench isolation regions 12 and the patterned gate stack can be readily carried out using conventional CMOS processing steps, which are not described in detail herein.

Figure 2:
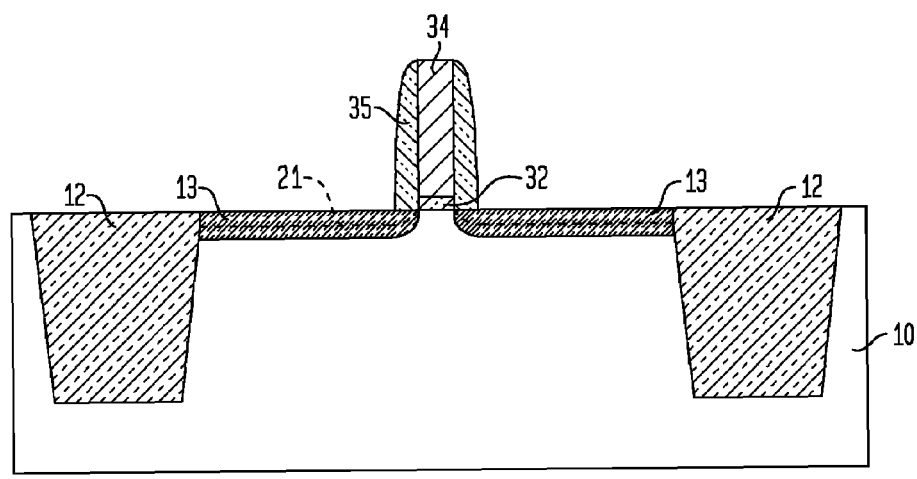
FIGS. 2-4 show cross sectional views that illustrate the exemplary processing steps for forming the n-FET of FIG. 1.

The patterned gate stack is then used as a mask for conducting, sequentially, a first masked pre-amorphization implantation (PAI), an n-type S/D extension implantation, an optional p-type halo implantation, and a first carbon implantation, thereby forming a first set of amorphous regions 13 in the semiconductor substrate 10, as shown in FIG. 2. Such amorphous regions 13 comprise n-type S/D extension implants (indicated by the S/D extension doping level 21), as well as implanted carbon ions.

The n-type S/D extension implantation and the optional p-type halo implantation can be readily carried out using conventional CMOS processing steps and are therefore not described in detail herein.

The first pre-amorphization implantation (PAI) is carried out to amorphize the single crystal semiconductor materials contained in the unmasked regions of the semiconductor substrate 10 by ion bombardment, thereby forming the amorphous regions 13 in the semiconductor substrate 10 adjacent to the patterned gate stack. Any suitable ions can be used for performing the first PAI step, and the thickness of the amorphous regions 13 is substantially determined by the ion bombardment energy, the atomic mass, and the implanted dosage of the ions used. For single crystal silicon, it is preferable to use ions such as Si, Ge, Xe, Si, P, As, etc. However, it is also possible for the unmasked regions of the semiconductor substrate 10 to be bombarded by other ions. The ion dosage used for the first PAI step is preferably selected to completely amorphize regions 13 in the semiconductor substrate 10, so such amorphous regions 13 can be recrystallized by solid phase epitaxy (SPE) on the semiconductor substrate 10 to again form a single crystal semiconductor material at relatively low annealing temperatures. When germanium is used during the first PAI step, a germanium ion dosage ranging from about $5 \times 10^{13}/cm^2$ to about $1 \times 10^{15}/cm^2$ is preferably employed.

Note that implantation of the extension dopant and the carbon atoms at certain energy levels and certain dosages may function to self-amorphizing the implanted regions. In such an event, the first PAI step is then not necessary.

The first carbon implantation can be conducted at any suitable energy level. Preferably, but not necessarily, the first carbon implantation is conducted at a relatively low energy level (i.e., in comparison with the second, subsequent carbon implantation step), which may range from about 0.5 KeV to about 15 KeV and more preferably from about 1 KeV to about 10 KeV. Because the implantation energy level determines the implantation depth, the carbon implants are preferably, but not necessarily, present in the amorphous regions 13 at a first, relatively shallow depth (i.e., in comparison with carbon implants formed by the second carbon implantation step). Alternatively, the first carbon implantation can be conducted either at a relatively high energy level or at substantially the same energy level (i.e., in comparison with the second, subsequent carbon implantation step), so that the carbon implants correspondingly are present in the amorphous regions 13 at either a relatively deep depth or approximately the same depth (i.e., in comparison with carbon implants formed by the second carbon implantation step).

The first carbon implantation is typically conducted at a relatively low carbon dosage (i.e., in comparison with the second, subsequent carbon implantation step), which may preferably range from about $1\times10^{14}/cm^2$ to about $1\times10^{16}/cm^2$, and more preferably from about $5\times10^{14}/cm^2$ to about $5\times10^{15}/cm^2$. Because the implantation dosage determines the implanted carbon concentration, the carbon implants are present in the amorphous regions 13 at a first, relatively low concentration (i.e., in comparison with the second, subsequent carbon implantation step).

After formation of the carbon-substituted amorphous regions 13, a sidewall spacer 36 is optionally formed over the semiconductor substrate along sidewalls of the patterned gate stack, as shown in FIG. 3. Alternatively, a sacrificial masking structure (not shown) can be formed along sidewalls of the patterned gate stack, either in place of or in addition to the offset spacer 36. Such a sacrificial masking structure is subsequently removed from the resulting n-FET structure after the fabrication process.

The patterned gate stack and the sidewall spacer 36 (or alternatively the sacrificial offset masking structure) are then used jointly as masks for conducting a second PAI, n-type S/D implantation, and a second carbon implantation, thereby forming a second set of amorphous regions 15 in the semiconductor substrate 10, as shown in FIG. 3. Such a second set of amorphous regions 15 comprises n-type S/D implants (indicated by the S/D doping level 23) as well as implanted carbon ions.

The n-type S/D implantation can be readily carried out using conventional CMOS processing steps and are therefore not described in detail herein.

The second PAI is carried out using the patterned gate stack and the sidewall spacer 36 (or alternatively the sacrificial offset masking structure) as masks to amorphize different regions of the semiconductor substrate 10 and form a second set of amorphous regions 15 in the semiconductor substrate 10 adjacent to the first set of amorphous regions 13, as shown in FIG. 3. The same or different ions can be used for performing the first and second PAI steps, but it is important to note that the implanted carbon concentration in the second set of amorphous regions 15 is higher than that in the first set of amorphous regions 13.

The ion dosage used for the second PAI step is preferably selected to completely amorphize regions 15 in the semiconductor substrate 10, so such amorphous regions 15 can be recrystallized by solid phase epitaxy (SPE) on the semiconductor substrate 10 to again form a single crystal semiconductor material. When germanium is used during the second PAI step, a germanium ion dosage ranging from about $5\times10^{13}/cm^2$ to about $2\times10^{15}/cm^2$ is preferably employed.

Note that implantation of the S/D dopant and the carbon atoms at certain energy levels and certain dosages may function to self-amorphizing the implanted regions. In such an event, the second PAI step is then not necessary.

The second carbon implantation can be conducted at any suitable energy level. Preferably, but not necessarily, the second carbon implantation is conducted at a relatively high energy level (i.e., in comparison with the first carbon implantation step), which may range from about 1 KeV to about 25 KeV, and more preferably from about 1 KeV to about 15 KeV.

Because the implantation energy level determines the implantation depth, the carbon implants are preferably, but not necessarily, present in the amorphous regions 15 at a second, relatively deep depth (i.e., in comparison with carbon implants formed by the first carbon implantation step). Alternatively, the second carbon implantation can be conducted either at a relatively low energy level or at substantially the same energy level (i.e., in comparison with the first carbon implantation step), so that the carbon implants correspondingly are present in the amorphous regions 15 at either a relatively shallow depth or approximately the same depth (i.e., in comparison with carbon implants formed by the first carbon implantation step).

The second carbon implantation is typically conducted at a relatively high carbon dosage (in comparison with that of the first carbon implantation), which may preferably range from about $5\times10_{14}/cm^2$ to about $2\times10^{16}/cm^2$, and more preferably from about $1\times10^{15}/cm^2$ to about $1\times10^{16}/cm^2$. As mentioned hereinabove, the implantation dosage determines the implant concentration. Therefore, the carbon implants are present in the amorphous regions 15 at a second, relatively high concentration in comparison with those in the amorphous regions 13.

After formation of the first and second sets of carbon-substituted amorphous regions 13 and 15, the amorphous regions 13 and 15 are then recrystallized by annealing, which effectuates solid phase epitaxy (SPE) and again form a single crystal semiconductor material (which is, however, doped with carbon atoms now) in regions 13 and 15 over the unamorphized regions of the substrate 10 thereunder. The annealing can be readily carried out in any manner, including, but not limited to: furnace anneal, rapid thermal anneal (RTA), flash anneal, and laser annealing. In a particularly preferred embodiment of the present invention, a flash anneal or laser anneal step is carried out for recrystallizing the carbon-substituted amorphous regions 13 and 15.

Correspondingly, the first and second patterned stressor layers 14 and 16, which comprise a carbon-substituted single crystal semiconductor material, are formed in the semiconductor substrate 10, as shown in FIG. 4. Specifically, the first patterned stressor layer 14 has a first, relatively low substitutional carbon concentration, and the second patterned stressor layer 16 has a second, relatively high substitutional carbon concentration.

The first and second patterned stressor layers 14 and 16 may be located in the semiconductor substrate 10 at substantially the same depth or at significantly different depths. In the specific embodiment illustrated by FIGS. 1-4, the first patterned stressor layer is located in the semiconductor substrate 10 at a first, relatively shallow depth, and the second patterned stressor layer is located in the semiconductor substrate 10 at a second, relatively deep depth. However, it is readily understood that the present invention broadly covers other alternative embodiments where the first patterned stressor layer 14 is located in the semiconductor substrate 10 at a relatively deep depth or at approximately the same depth in comparison with the second patterned stressor layer 16.

Further, the S/D implants, the extension implants, and the patterned gate stack conjunctionally define an n-FET with S/D regions 22 and 24, S/D extension regions 26 and 28, a channel region 30, and a patterned gate stack located over the channel region 30, as shown in FIG. 4. The first patterned stressor 14 comprises two portions that are respectively located at the S/D extension regions 26 and 28 of the resulting n-FET. The second patterned stressor 16 also comprises two portions, which are respectively located at the S/D regions 22 and 24 of the resulting n-FET, as shown in FIG. 4.

Further, a silicidation process can be carried out to form the S/D silicide contact layers 22A and 22B and the gate silicide contact layer 34A shown in FIG. 1, and conventional back-end-of-line (BEOL) processing steps can also be carried out to complete the n-FET device structure. The S/D silicide contact layers 22A and 22B cover the second patterned stressor layer 16, and they may also cover at least a portion of the first patterned stressor layer 14. The silicidation and BEOL processes are both well known in the art and are therefore not described in detail herein.

The n-FET device of the present invention uses a dual stressor structure to apply desired tensile stress to the channel region of the n-FET device, while minimizing potential deleterious impacts of crystal defects and interstitial carbon atoms on the n-FET device performance. Therefore, an improved stress profile is achieved in the n-FET device of the present invention, without otherwise compromising the n-FET device performance.

Note that in these drawings, which are not drawn to scale, like and/or corresponding elements are referred to by like reference numerals. It is further noted that in the drawings, only one FET is shown on a semiconductor substrate. Although illustration is made to such an embodiment, the present invention is not limited to the formation of any specific number of FETs on the semiconductor substrate.

While FIGS. 1-4 illustratively demonstrates an exemplary n-FET structure and exemplary processing steps for fabricating same, according to specific embodiments of the present invention, it is clear that a person ordinarily skilled in the art can readily modify the device structure and the process steps illustrated herein, for adaptation to specific application requirements, consistent with the above descriptions. For example, although FIGS. 1-4 only show the dual stressors of the present invention without any other stress-inducing structures, it is understood that such dual stressors can be readily used in combination with other known stress-inducing structures, such as stress-inducing liners or cap layers, for further improving the electron mobility in the n-FETs of the present invention. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for forming a semiconductor device comprising:
    forming a patterned gate stack over a substrate that comprises a single crystal semiconductor;
    forming a first set of amorphous regions in the substrate using the patterned gate stack as a mask, wherein said first set of amorphous regions comprise n-type source and drain (S/D) extension implants, and wherein said first set of amorphous regions further comprise implanted carbon ions at a first carbon concentration;
    forming one or more offset masking structures along sidewalls of the patterned gate stack,
    forming a second set of amorphous regions in the substrate using the patterned gate stack and the one or more offset masking structures as masks, wherein said second set of amorphous regions comprise n-type S/D implants, and wherein said second set of amorphous regions further comprise implanted carbon ions at a second, higher carbon concentration; and
    annealing the substrate to recrystallize the first and second sets of amorphous regions, thereby forming an n-channel field effect transistor (n-FET) comprising S/D extension regions and S/D regions, wherein the S/D extension regions comprise a first patterned stressor layer comprising a carbon-substituted and tensilely stressed single crystal semiconductor material and having a first substitutional carbon concentration, and wherein the S/D regions comprise a second patterned stressor layer also comprising the carbon-substituted and tensilely stressed single crystal semiconductor material but having a second, higher substitutional carbon concentration.

2. The method of claim 1, wherein the first substitutional carbon concentration ranges from about 0.2 atomic % to about 1.5 atomic %, and wherein the second, higher substitutional carbon concentration ranges from about 0.8 atomic % to about 3 atomic %.

3. The method of claim 1, wherein the first substitutional carbon concentration ranges from about 0.5 atomic % to about 1.3 atomic %, and wherein the second, higher substitutional carbon concentration ranges from about 1.3 atomic % to about 2.5 atomic %.

4. The method of claim 1, wherein the first set of amorphous regions are located in the substrate at a first depth ranging from about 5 nm to about 80 nm, and wherein the second set of amorphous regions are located in the substrate at a second, deeper depth ranging from about 10 nm to about 150 nm.

5. The method of claim 4, wherein the first depth ranges from about 10 nm to about 50 nm, and wherein the second depth ranges from about 20 nm to about 80 nm.

6. The method of claim 1, wherein the substrate comprises single crystal silicon, and wherein the first and second patterned stressor layers comprise carbon-substituted and tensilely stressed single crystal silicon.

7. The method of claim 1, further comprising forming source and drain silicide layers located over the second patterned stressor layer and optionally at least a portion of the first patterned stressor layer.

8. A method for forming a semiconductor device comprising:
    forming a patterned gate stack over a substrate that comprises a single crystal semiconductor;
    conducting a first masked pre-amorphization implantation to form a first set of amorphous regions in the substrate;
    conducting n-type source and drain (S/D) extension implantation at the first set of amorphous regions;
    conducting a first carbon implantation to implant a first dosage of carbon ions into the first set of amorphous regions;
    forming one or more masking structures along sidewalls of the patterned gate stack;
    conducting a second masked pre-amorphization implantation to form a second set of amorphous regions in the substrate;
    conducting n-type S/D implantation at the second set of amorphous regions;
    conducting a second carbon implantation to implant a second, larger dosage of carbon ions into the second set of amorphous regions; and
    annealing the substrate to recrystallize the first and second sets of amorphous regions, thereby forming an n-channel field effect transistor (n-FET) comprising source/drain (S/D) extension regions and S/D regions, wherein the S/D extension regions comprises a first patterned stressor layer that comprises a carbon-substituted and tensilely stressed single crystal semiconductor material and has a first substitutional carbon concentration, and wherein the S/D regions comprises a second patterned stressor layer that also comprises the carbon-substituted and tensilely stressed single crystal semiconductor material but has a second, higher substitutional carbon concentration.

9. The method of claim 8, wherein the first carbon implantation step is conducted at a first energy level ranging from about 0.5 KeV to about 10 KeV, and wherein the second carbon implantation step is conducted at a second, higher energy level ranging from about 1 KeV to about 25 KeV.

10. The method of claim 9, wherein the first energy level ranges from about 1 KeV to about 10 KeV, and wherein the second, higher energy level ranges from about 1 KeV to about 15 KeV.

11. The method of claim 8, wherein the first dosage of carbon ions ranges from about $1\times10^{14}/cm^2$ to about $1\times10^{16}/cm^2$, and wherein the second, higher dosage of carbon ions ranges from about $5\times10^{14}/cm^2$ to about $2\times10^{16}/cm^2$.

12. The method of claim 8, wherein the first dosage of carbon ions ranges from about $5\times10^{14}/cm^2$ to about $5\times10^{15}/cm^2$, and wherein the second, higher dosage of carbon ions ranges from about $1\times10^{15}/cm^2$ to about $1\times10^{16}/cm^2$.

13. The method of claim 8, wherein the first substitutional carbon concentration ranges from about 0.2 atomic % to about 2.5 atomic %, and wherein the second, higher substitutional carbon concentration ranges from about 0.5 atomic % to about 4 atomic %.

14. The method of claim 8, wherein the first substitutional carbon concentration ranges from about 0.5 atomic % to about 2 atomic %, and wherein the second, higher substitutional carbon concentration ranges from about 0.8 atomic % to about 3 atomic %.

15. The method of claim 8, wherein the first patterned stressor layer is located at the S/D extension regions of the n-FET at a first depth ranging from about 5 nm to about 80 nm, and wherein the second patterned stressor layer is located at the S/D regions of the n-FET at a second, deeper depth ranging from about 10 nm to about 150 nm.

16. The method of claim 15, wherein the first depth ranges from about 10 nm to about 50 nm, and wherein the second, deeper depth ranges from about 20 nm to about 80 nm.

17. The method of claim 8, wherein the substrate comprises single crystal silicon, and wherein the first and second patterned stressor layers comprise carbon-substituted and tensilely stressed single crystal silicon.

18. The method of claim 8, further comprising forming source and drain silicide layers over the second patterned stressor layer and optionally at least a portion of the first patterned stressor layer.

* * * * *